(12) United States Patent
Amaral et al.

(10) Patent No.: US 9,712,174 B1
(45) Date of Patent: Jul. 18, 2017

(54) DOUBLE CALIBRATION LOOP FOR RANDOM SPREAD SPECTRUM MODULATOR

(71) Applicant: Infineon Technologies AG, Neubiberg (DE)

(72) Inventors: Pedro Amaral, Villach (AT); Florin Bulhac, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/986,866

(22) Filed: Jan. 4, 2016

(51) Int. Cl.
*H03L 7/07* (2006.01)
*H03L 7/099* (2006.01)
*H03K 3/84* (2006.01)
*H03L 7/093* (2006.01)
*H03L 7/18* (2006.01)
*H03L 1/00* (2006.01)

(52) U.S. Cl.
CPC .............. *H03L 7/07* (2013.01); *H03K 3/84* (2013.01); *H03L 1/00* (2013.01); *H03L 7/093* (2013.01); *H03L 7/0991* (2013.01); *H03L 7/18* (2013.01)

(58) Field of Classification Search
CPC ............ H03K 23/54; H03L 7/00; H03L 7/093
USPC ......... 327/156, 158, 161; 375/371, 374, 375
See application file for complete search history.

(56) References Cited

U.S. PATENT DOCUMENTS

| 7,358,820 B2* | 4/2008 | Da Dalt | H03L 7/093 331/1 A |
| 2016/0065223 A1* | 3/2016 | Galton | H03L 7/197 327/159 |

* cited by examiner

*Primary Examiner* — John Poos
(74) *Attorney, Agent, or Firm* — Shumaker & Sieffert, P.A.

(57) ABSTRACT

Representative implementations of devices and techniques provide calibration for a spread spectrum PLL device modulator. A first calibration loop includes a cross correlator to correlate a sequence of random or pseudo-random signals injected into a signal path of the PLL device to a phase error signal of the PLL device. A second calibration loop includes a bandwidth tuner to tune a bandwidth of the PLL device and to reduce a jitter of the PLL device.

24 Claims, 7 Drawing Sheets

| condition | Chosen alfa, beta |
|---|---|
| -1/8*expected < Actual-Expected < 1/8*expected | Alfa = 1/32, beta = 1 (default) |
| 1/8*expected < Actual-Expected < 2/8*expected | Alfa = (5/4)x1/32, beta = (5/4)x1 |
| 2/8*expected < Actual-Expected < 3/8*expected | Alfa = (6/4)x1/32, beta = (6/4)x1 |
| 3/8*expected < Actual-Expected < 4/8*expected | Alfa = (7/4)x1/32, beta = (7/4)x1 |
| 4/8*expected < Actual-Expected < 5/8*expected | Alfa = 1/16, beta = x2 |
| -2/8*expected < Actual-Expected < -1/8*expected | Alfa = X(1/64)x(7/4), beta = X(1/2)x(7/4) |
| -3/8*expected < Actual-Expected < -2/8*expected | Alfa = X(1/64)x(6/4), beta = X(1/2)x(6/4) |
| -4/8*expected < Actual-Expected < -3/8*expected | Alfa = X(1/64)x(5/4), beta = X(1/2)x(5/4) |
| -5/8*expected < Actual-Expected < -4/8*expected | Alfa = 1/64, beta = ½ |

FIG. 5

700
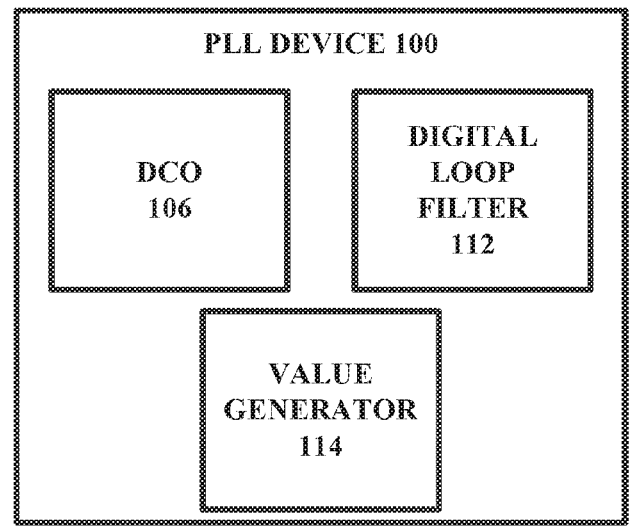
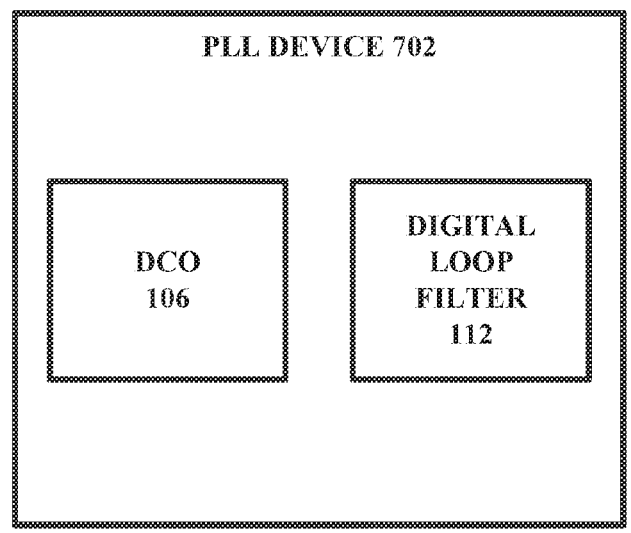
FIG. 7

DOUBLE CALIBRATION LOOP FOR RANDOM SPREAD SPECTRUM MODULATOR

BACKGROUND

Typically, a clocking signal used in a digital core is delivered by an on-chip clock generation unit or frequency synthesizer. The clock generation unit may be a Phase Locked Loop (PLL) device, which could also be implemented in the form of a digital PLL. However, such clocking signals may be a source of electromagnetic interference (EMI) to other portions of a system utilizing the digital core. Undesirable electromagnetic energy may propagate throughout the system, or to the external environment, and cause adverse effects to other susceptible devices.

Electromagnetic compatibility (EMC) requirements in various industries, such as the automotive and consumer electronics industries, for example, put stringent limits on the emission of electromagnetic radiation of electronic devices. Accordingly, spread spectrum clocks have been developed for use in digital cores that spread the electromagnetic energy over a wide frequency spectrum, thereby reducing the magnitude of energy at or near a given frequency. A spread spectrum clock may be produced by modulating the output frequency of a PLL, for example, with a low-frequency pattern that "spreads" the energy of the clock signal over a wider bandwidth, effectively reducing the peak spectrum electromagnetic emission.

In some microcontrollers, a single source is typically used to produce the clocks for both the digital core and the low-speed data peripherals. In this scenario, a standard low frequency periodic modulation may not be used, since the accumulated jitter caused by the modulation can exceed the specified jitter limits of the data peripherals, causing transmission to fail. For instance, a 50 kHz triangular modulation with a peak-to-peak modulation amplitude (MA) of 1.5% produces an accumulated jitter of 37.5 ns. Such approaches cannot be used for applications with tight maximum jitter allowances (e.g., 10 ns max jitter).

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIG. 5 is a table showing example correction factors for a loop filter, according to an implementation.

FIG. 7 is a block diagram of an electrical circuit or system that includes a least a first PLL device and a second PLL device.

DETAILED DESCRIPTION

Overview

Figure 1:
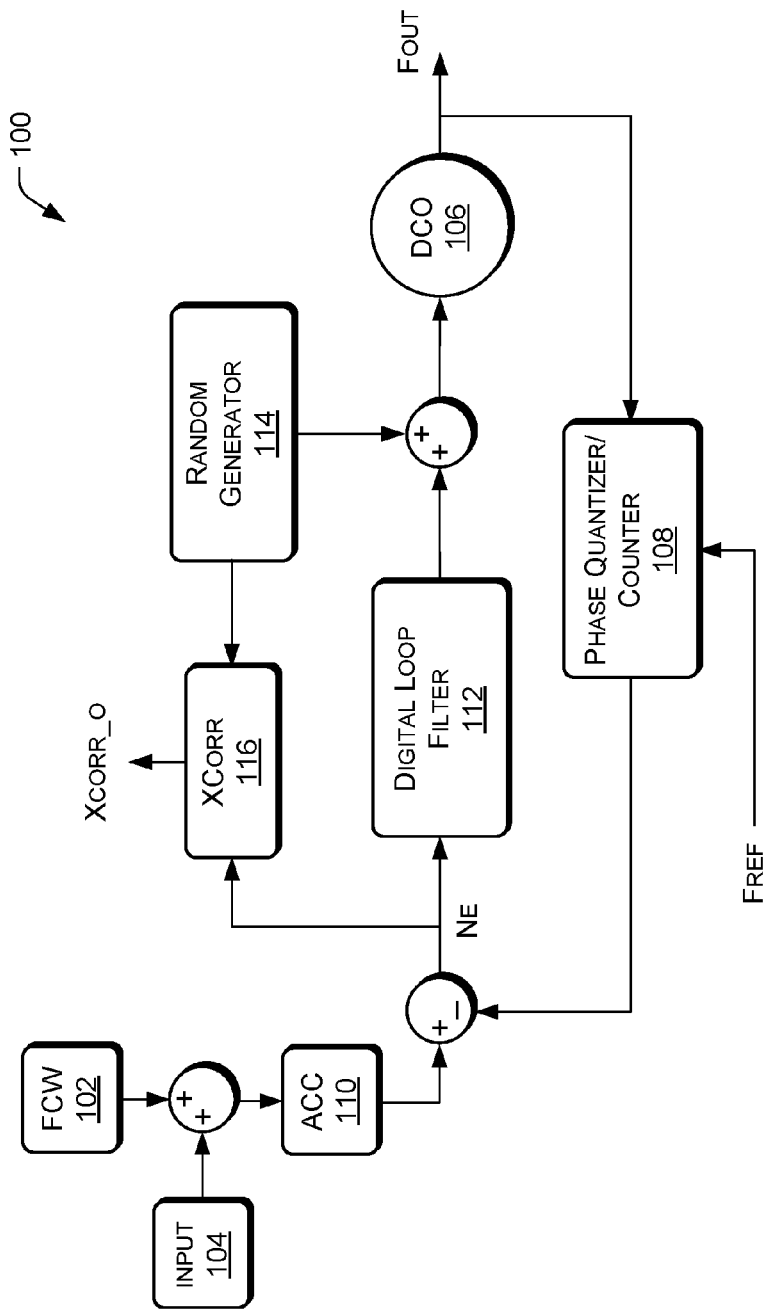
FIG. 1 is a block diagram of an example phase locked loop (PLL) device including a random or pseudo-random generator, according to an implementation.

Representative implementations of devices and techniques provide calibration for a spread spectrum modulated PLL device. For example, the calibration may reduce electromagnetic interference (EMI) of the PLL device while minimizing short-term and long-term jitter, allowing the PLL device to be used in a wider range of applications. In a frequency synthesizer, such as a phase lock loop (PLL) device, a clocking signal is generated based on an input signal and/or a control word. A sequence of random or pseudo-random values may be generated and used to modulate an output signal of the frequency synthesizer, resulting in a spread spectrum clocking signal.

While the spread spectrum clocking signal reduces peak EMI energy at frequencies of interest, in some cases short-term and long-term jitter may result. A double calibration arrangement may be used with the PLL device to mitigate short-term and long-term jitter and maintain electromagnetic compatibility. In an implementation, a first calibration loop includes a cross correlator to correlate the sequence of random or pseudo-random signals injected into a signal path of the PLL device to a phase error signal of the PLL device. In another implementation, a second calibration loop includes a bandwidth tuner to tune a bandwidth of the PLL device and to reduce the jitter of the PLL device.

Various implementations and techniques of calibrating a spread spectrum clock generator (such as a modulated PLL device, for example) are discussed in this disclosure. Techniques and devices are discussed with reference to example PLL device block diagrams illustrated in the figures. However, the techniques and devices discussed may be applied to any of various frequency synthesizer designs, circuits, and devices and remain within the scope of the disclosure. Further, the techniques and devices discussed herein are referred to in the environment of a digital PLL device for ease of discussion and illustrative convenience. The techniques and/or devices may also be used in other implementations, circuits, systems, and the like, including digital, analog, or mixed signal PLL systems, to generate a spread spectrum clocking signal and to calibrate for electromagnetic compatibility and reduced jitter.

Advantages of the disclosed techniques and devices are varied, and include: 1) constant phase margin, thus improving the interoperability of synchronous interfaces with external systems; 2) better spread of the emission spectrum; 3) consistent PLL device bandwidth; 4) reduced short-term and long-term jitter; 5) improved electromagnetic compatibility with devices, systems, and applications, e.g., better EMI mitigation; and 6) power and area advantages in the digital core. Other advantages of the disclosed techniques may also be present.

Implementations are explained in more detail below using a plurality of examples. Although various implementations and examples are discussed here and below, further implementations and examples may be possible by combining the features and elements of individual implementations and examples.

Example PLL Device Arrangement

Figure 2:
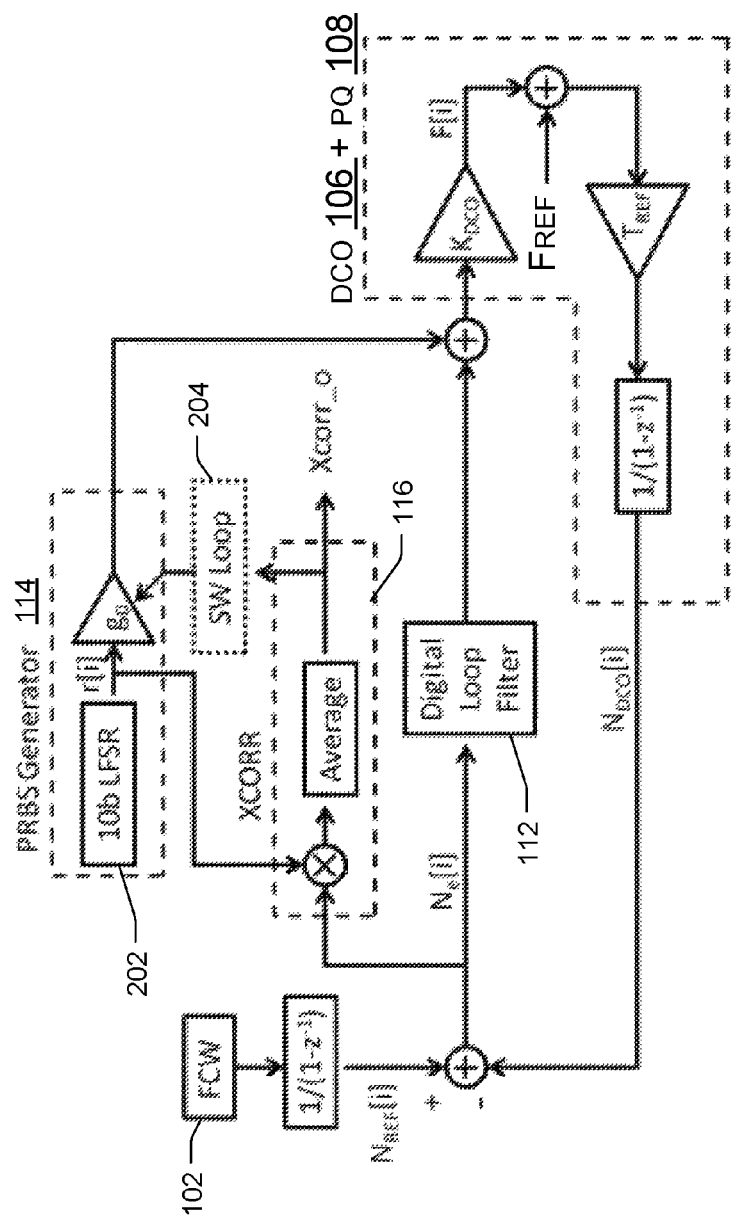
FIG. 2 is a linear model of the example PLL device of FIG. 1, according to an implementation.

FIG. 1 is a block diagram of an example phase locked loop (PLL) device 100, according to an implementation. FIG. 2 is an illustration of a linear model of the example PLL device of FIG. 1, according to an implementation. It is to be understood that PLL devices 100 (including like frequency synthesizer arrangements) may be implemented as stand-alone circuits, apparatuses, or devices, or as part of another system (e.g., integrated with other components, processors, etc.).

The illustrations of FIGS. 1-6, and the techniques and devices described are for ease of discussion, and not intended to be limiting, and may be applied to other types of frequency synthesizers (e.g., direct analog synthesizer, direct digital synthesizer, integer-N, fractional-N, digiphase synthesizer, etc.), or other PLL designs, without departing from the scope of the disclosure. In various implementations, one or more components of the PLL device 100 are implemented at least in part in hardware. For example, some components of the PLL device 100 may be implemented at least in part using accumulators, adders, flip-flops, inverters, and the like. In some cases, additional or alternative components may be used to implement the techniques described herein.

As shown in FIGS. 1 and 2, a PLL device 100 generates (i.e., synthesizes) an output signal (e.g., clocking signal) $F_{OUT}$ based on a control word 102 and/or an input signal 104. A digitally-controlled oscillator (DCO) 106 generates the output signal $F_{OUT}$, which may be a multi-phase signal in some embodiments. The output signal $F_{OUT}$ is processed by a phase quantizer 108 to generate phase information, which is subtracted from the accumulated (via accumulator 110) frequency control word (FCW) 102. The resulting phase error (Ne) is used to tune the frequency of the DCO 106 via a digital loop filter (DLF) 112.

In an implementation as shown in FIGS. 1 and 2, a random or pseudo-random sequence is generated via a random generator 114 (such as a pseudo-random binary sequence (PRBS) generator, for example) and added to the DLF 112 output, to form the spread spectrum output. For example, the random or pseudo-random sequence modulates the output frequency $F_{OUT}$ of the PLL device 100, thus producing the spread spectrum effect on the energy of the clock signal. Modulating the output frequency spreads the energy over a wider bandwidth, and effectively reduces the peak spectrum electromagnetic emission. Since the random or pseudo-random modulation (RM) has to be fast (larger than the PLL device 100 bandwidth), the random or pseudo-random sequence cannot be injected at the feedback path or at the FCW 102, since the transfer function to the PLL 100 input is low-pass.

In an implementation, as shown in FIGS. 1 and 2, the random or pseudo-random sequence is injected in the signal path comprising the output of the DLF 112 and the input to the DCO 106. The transfer function to the PLL 100 output is high-pass, so the random or pseudo-random modulation is transferred almost undistorted. Without the effects of low-frequency jitter, which may accumulate over time, the average PLL 100 output frequency is equal to the nominal frequency.

In an implementation, the random generator 114 may be implemented using a Linear-Feedback Shift Register (LFSR) 202 (as shown in FIG. 2, for example), and may be clocked by the reference clock $F_{REF}$. The choice of a bit length for the LFSR 202 can be subject to a tradeoff. For example, an LFSR 202 with too few bits can produce rapidly repeating sequences, and can introduce spurious spectral tones that can limit the EMI reduction. However, an LFSR 202 with many bits can increase area, power and (potentially) accumulated jitter. In an implementation, an LFSR 202 with 10 bits may be used as a good balance (as shown in FIG. 2). In other embodiments, an LFSR 202 with more or fewer bits may be used according to the characteristics desired.

Referring to FIG. 2, the output "r" of the LFSR 202, which comprises the random or pseudo-random sequence (normalized to the range [−1:1]), is multiplied by a modulation gain $g_0$ before being added to the DLF 112 output. The resulting peak-to-peak modulation amplitude is $2 \times g_0 \times K_{DCO}$, where $K_{DCO}$ is the gain of the DCO 106, and can be changed by adjusting $g_0$.

Example Double Calibration Arrangement

Figure 3:
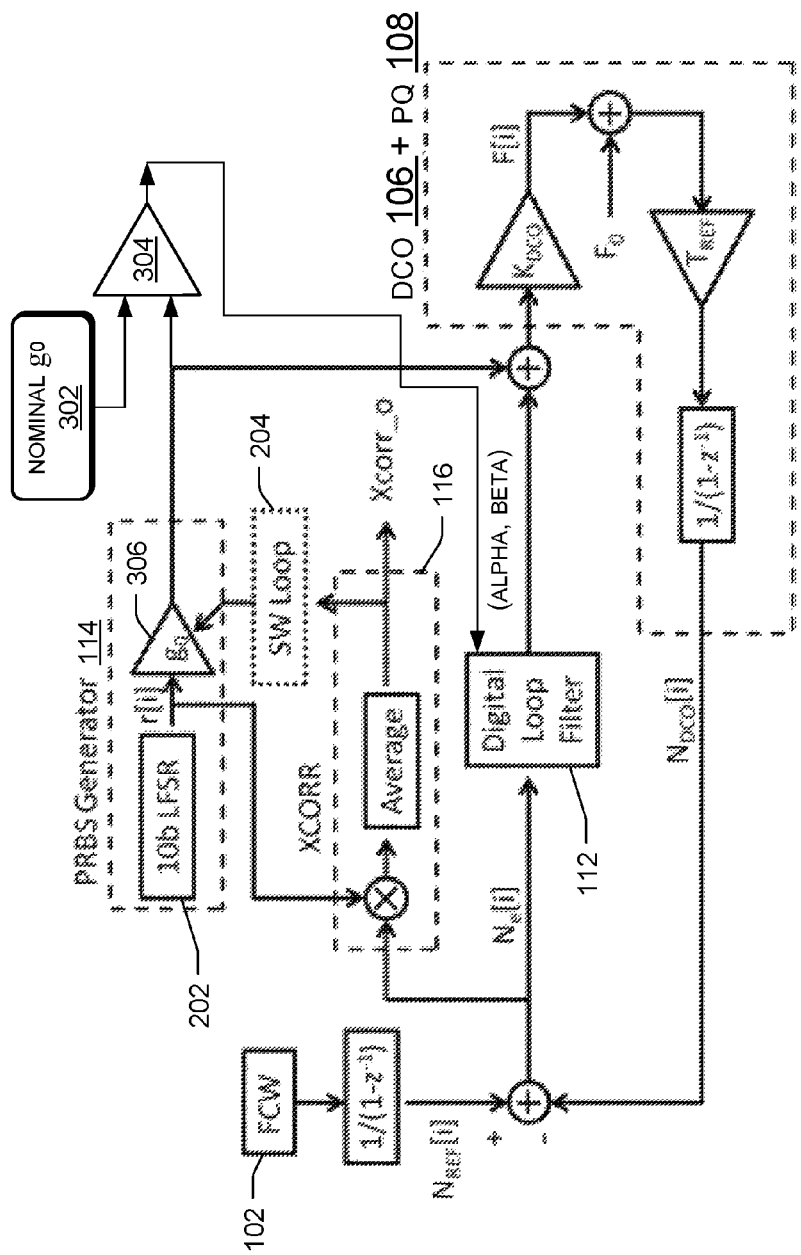
FIG. 3 is a linear model of an example PLL device including double calibration loops, according to an implementation.

FIG. 3 is a linear model of an example PLL device 100 including double calibration loops, according to an implementation. In an implementation, the DCO 106 is implemented using a matrix of CMOS inverters, for example, whose delays are sensitive to process and temperature variations, resulting in considerable variations in $K_{DCO}$ and thus also the peak-to-peak modulation amplitude, which affects long term jitter performance. For instance, in one example, the $K_{DCO}$ varies from 2.0 MHz/LSB to 5.5 MHz/LSB, with a nominal value of 3.6 MHz/LSB, based on process and/or temperature changes. Further, variations in $K_{DCO}$ not only can change the modulation amplitude, but can also vary the PLL loop bandwidth. For example, in some cases the bandwidth has a sqrt( ) dependency on the $K_{DCO}$. The effect of the $K_{DCO}$ in the short term jitter is corrected by the first loop whereas to correct effect the $K_{DCO}$ on the long term jitter, the additional $2^{nd}$ loop is necessary. By controlling the spread of the long term jitter across process, voltage and/or temperature changes, an effective reduction in jitter or EMI improvement can be obtained: by reducing the maximum jitter value (across variations) and keeping the modulation amplitude constant, a decrease in the maximum jitter for a given EMI reduction is obtained. Alternatively, the modulation amplitude can be increased until a given maximum jitter (across variations) is obtained, but allowing for a higher EMI reduction.

In an implementation, a first background calibration loop based on a cross-correlation between the phase error Ne and the LFSR 202 output, r, is used to mitigate the $K_{DCO}$ variance. In an example, as shown in FIGS. 2 and 3, the first calibration loop includes a cross correlator (XCORR) 116 arranged to correlate the sequence of random or pseudo-random signals injected into a signal path of the PLL device to the phase error signal Ne of the PLL device 100. In the example, the output of the phase detector Ne is multiplied by the random or pseudo-random sequence r and the result is averaged by the XCORR 116. In an implementation, the average is used to estimate a gain of the DCO 106 of the PLL device 100. If the random sequence r has a zero mean, a first order analysis shows that the output of XCORR 116 is given by:

$$\sigma r^2 \times K_{DCO} \times \frac{g_0}{F_{REF}},$$

where σr² is the variance of the sequence r. In an implementation, this result can be used to estimate $K_{DCO}$ (all other parameters are known) and to calibrate the MA, by programming $g_0$ to keep $g_0 \times K_{DCO}$ constant. In an implementation, an output of XCORR 116 adjusts the modulation gain $g_0$, which may be used to adjust the gain $K_{DCO}$ according to the relationship shown above. In one example, the first calibration loop need only track temperature variations and can be implemented in a microcontroller firmware, software, or the like (shown as SW Loop 204, in the example of FIGS. 2 and 3).

In another implementation, although the random or pseudo-random sequence r and the phase error Ne have 10 bits and 22 bits of resolution, respectively, the $K_{DCO}$ can be estimated fairly accurately by using only the 4 most significant bits (MSBs) of each (r and Ne), reducing the complexity of the multiplier. In other implementations, the $K_{DCO}$ can be estimated using other bit portions (including the entire bit string) of the random or pseudo-random sequence r and the phase error Ne.

In an implementation, a second calibration loop includes a bandwidth tuner to tune a bandwidth of the PLL device 100 and to reduce a jitter of the PLL device (due to gain variances). In the implementation, as shown in FIG. 3, the second calibration loop includes a nominal $g_0$ source 302 (modulation amplitude gain) and a comparator 304. In the implementation, the comparator 304 compares the value of the actual modulation gain $g_0$ (output from amplifier 306) to an expected nominal value 302. In the implementation, the second calibration loop detects a deviation of the nominal gain $g_0$ from the actual gain $g_0$ (gain to which the first calibration loop has converged) or in other words, an actual gain from an expected gain of the amplitude modulation signal $r*g_0$.

Since the gain $K_{DCO}$ is dependent on the modulation gain $g_0$, the second calibration loop is arranged to detect a deviation with regard to the DCO 106, the modulation signal amplifier 306, and/or the bandwidth of the PLL device 100, and apply a correction to the deviation. In other words, the second calibration loop is arranged to detect and correct a deviation of a bandwidth of the PLL device 100 via detection and correction of the deviation of the gain $K_{DCO}$ of the DCO 106 or the gain $g_0$ of the modulation signal.

Figure 4:
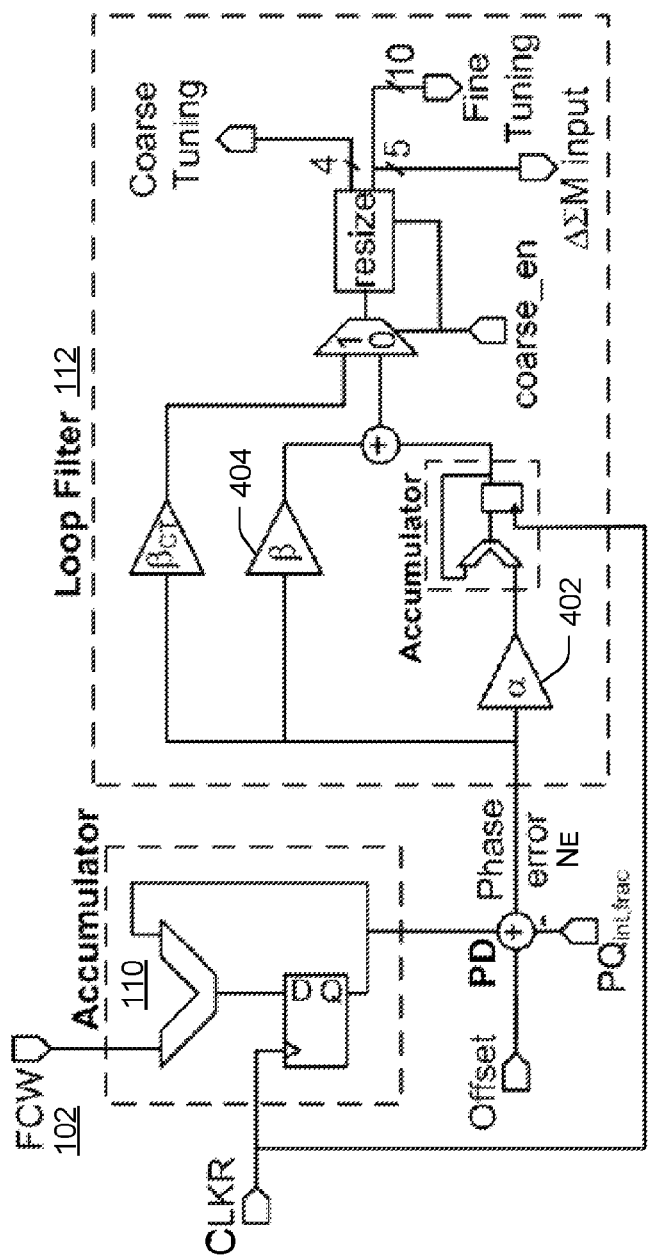
FIG. 4 is a block diagram of an accumulator, a phase detector, and a loop filter of an example PLL device, according to an implementation.

FIG. 4 is a block diagram showing example detail of the accumulator 110, a phase detector, and the digital loop filter 112 of the example PLL device 100, according to an implementation. Referring to FIGS. 3 and 4, the PLL device 100 (via the DCO 106) is controlled by the digital loop filter 112 with parameters alpha 402 (integral parameter) and beta 404 (proportional parameter). When the alpha 402/beta 404 ratio is constant across the retuning of the DCO 106, the phase margin of the PLL device 100 is also constant (e.g., a phase locked loop).

In an implementation, the second calibration loop is arranged to tune the integral parameter 402 (alpha) and/or the proportional parameter 404 (beta) of the digital loop filter 112 to maintain a constant ratio of the integral parameter 402 to the proportional parameter 404. In various implementations, the second calibration loop may use a look-up table, or the like, to determine correction factors (e.g., multipliers) for alpha 402 and/or beta 404, based on the deviation detected (i.e., actual v. expected) in the MA gain $g_0$ or the DCO 106 gain $K_{DCO}$.

FIG. 5 is a table showing example correction factors for a digital loop filter 112, according to an implementation. As shown in FIG. 5, a correction factor (e.g., multiplier) may be applied to one or both of the alpha 402 and beta 404 parameters, based on a detected deviation ("condition") of the MA gain $g_0$ or the DCO 106 gain $K_{DCO}$. For example, according to the example table of FIG. 5, with a ±⅛ deviation of actual gain from expected gain, the alpha parameter 402 is multiplied by a correction factor of ¹⁄₃₂, and the beta parameter 404 is multiplied by a correction factor of 1 (unchanged). In various implementations, other correction factor values may be used to maintain the desired alpha 402/beta 404 ratios, and the like.

In alternate implementations, an unmodulated PLL device may take advantage of the benefits of a double calibration technique to improve jitter performance. For example, in one implementation, two identical (or very similar) PLL devices are used, one with modulation active, and another one (with a different frequency plan, possibly), with no modulation active. The unmodulated PLL device may be used to clock ADCs/DACs, for instance.

In the implementation, retuning the bandwidth e.g., applying correction factors to the modulated PLL device 100, can be applied to the unmodulated PLL device, thereby improving the spread (across process, temperature and voltage variations) of the long term jitter of the unmodulated PLL device as well.

In one implementation, for example, an electrical circuit or system 700, as shown in FIG. 7, includes a first PLL device 100 including a first DCO 106 to generate a first clocking signal, a value generator 114 arranged to generate a sequence of random or pseudo-random values to modulate a frequency of the first clocking signal to form a spread-spectrum clocking signal, and a first digital loop filter 112, arranged in an input signal path of the first DCO 106 to control the first DCO 106. The circuit 700 also includes a double calibration loop arranged to detect a deviation of an actual modulation gain to an expected modulation gain and to apply a first correction factor to a first integral parameter 402 (alpha) and/or a second correction factor to a first proportional parameter 404 (beta) of the first digital loop filter 112 based on the deviation detected.

Additionally, the circuit 700, as shown in FIG. 7, includes a second PLL device 702 including a second DCO 106 to generate a second clocking signal, a second digital loop filter 112, arranged in an input signal path of the second DCO 106 to control the second DCO 106. In the implementation, the second PLL device 702 does not need its own calibration loops. Instead, the second PLL device 702 is calibrated by applying the first and second correction factors (determined for the first PLL device 100) to a second integral parameter 402 (alpha) and/or a second proportional parameter 404 (beta), respectively, of the second digital loop filter 112 (of the second PLL device).

In an implementation, using this technique to tune the second PLL device, there is no extra penalty in area or power consumption to improve the performance of the unmodulated second PLL device.

Representative Process

Figure 6:
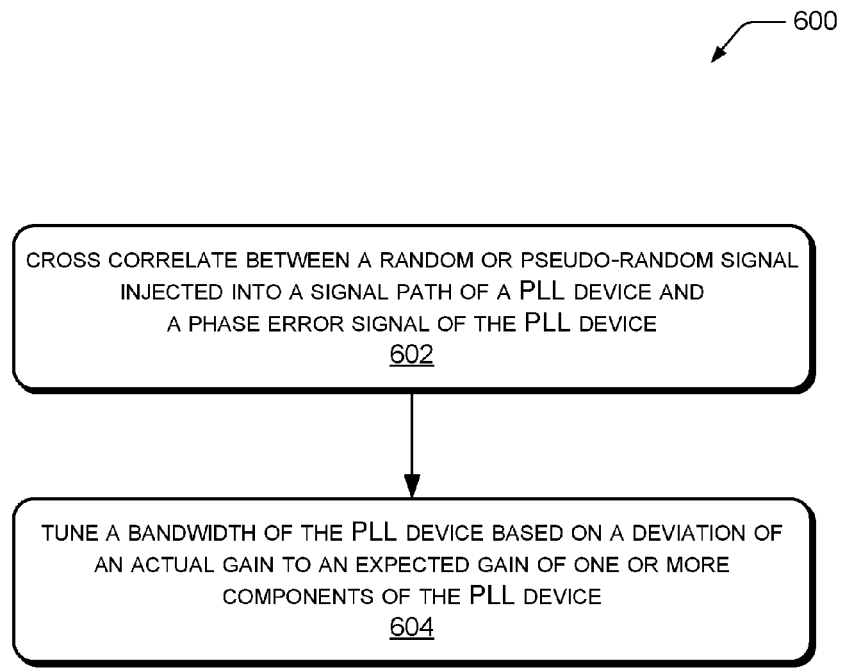
FIG. 6 is a flow diagram illustrating an example process for calibrating a spread spectrum PLL device, according to an implementation.

FIG. 6 illustrates a representative process 600 for calibrating a spread spectrum clock generator (such as PLL device 100, for example), according to an implementation. An example process 600 includes a double calibration arrangement, comprising two calibration loops. The process 600 is described with reference to FIGS. 1-5.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein.

In an implementation, a PLL device, (such as PLL device 100, for example) synthesizes and modulates a frequency of a clocking signal. For example, the clocking signal may be generated or synthesized by a digitally controlled oscillator (such as DCO 106, for example) of the PLL device, which is tuned by a phase error signal. In an implementation, the clocking signal is modulated with a sequence of random or pseudo-random values, to form a spread spectrum clocking signal. In one implementation, the random or pseudo-random sequence is injected into a signal path of the frequency synthesizer, at the input to the DCO. In other implementations, the random or pseudo-random sequence may be injected at other points within the PLL device.

At block 602, the process includes applying a first calibration loop, comprising cross correlating between the random or pseudo-random signal injected into the signal path of the PLL device and a phase error signal of the PLL device. For example, the cross correlating may include detecting a variance of the random or pseudo-random sequence, and using the variance to adjust a modulation gain of the PLL device and/or adjust a gain of the DCO.

At block 604, the process includes tuning a bandwidth of the PLL device based on a deviation of an actual gain to an expected gain of one or more components of the PLL device. For instance, in various implementations, the one or more components of the PLL device comprise the digitally controlled oscillator (DCO) and/or a modulation signal amplifier (e.g., $g_0$).

In an implementation, the process includes tuning an integral parameter (e.g., alpha) and/or a proportional parameter (e.g., beta) of a loop filter (such as DLF 112, for example) of the PLL device. For instance, the process includes detecting the deviation of the actual gain to an expected gain of the one or more components of the PLL device, and applying a correction factor to the integral parameter and/or to the proportional parameter based on the detected deviation. In one implementation, the process includes multiplying the integral parameter and/or the proportional parameter by a correction factor from a look-up table (or the like) based on the deviation detected. In various implementations, the look-up table (or the like) may be integrated into firmware, software, etc. of controlling components of the PLL device.

In an implementation, the process includes maintaining a constant ratio of the integral parameter to the proportional parameter during changes in process, voltage, or temperature of the PLL device. For example, the correction factors (e.g., multipliers) can be applied to the integral parameter and/or to the proportional parameter during variances in process, voltage, or temperature to maintain the ratio.

In an implementation, the process includes maintaining a constant phase margin of the PLL device during changes in process, voltage, or temperature of the PLL device. In another implementation, the process includes maintaining a constant effective amplitude of a random or pseudo-random modulation signal of the PLL device during changes in process, voltage, or temperature of the PLL device via the cross correlating and the tuning. In a further implementation, the process includes maintaining a gain of a digitally controlled oscillator (DCO) of the PLL device during changes in process, voltage, or temperature of the PLL device via the cross correlating and the tuning. In various implementations, the correction factors may be applied as described above to maintain the phase margin, effective amplitude, and DCO gain. In other implementations, the correction factors may be applied as described to adjust or maintain other parameters of the PLL device.

In an implementation, the process includes comparing an actual value of an amplitude modulation gain (e.g., $g_0$) to an expected nominal value to detect a deviation of a gain of a digitally controlled oscillator (DCO) of the PLL device from nominal, and a deviation of the bandwidth of the PLL device.

In an implementation, the process includes reducing a jitter or a spread of the jitter of the PLL device based on the cross correlating and the tuning. In another implementation, the process includes improving an electromagnetic compatibility of the PLL device during changes in process, voltage, or temperature of the PLL device via the cross correlating and the tuning.

In a further implementation, the process includes modulating a frequency of a clocking signal of the PLL device with a random or pseudo-random signal to form a spread-spectrum clocking signal, and calibrating the PLL device via the cross correlating and the tuning at one or more pre-defined intervals to reduce or eliminate jitter and to reduce electromagnetic interference of the PLL device.

For example, in the implementation, the double calibration loop may be applied to retune the PLL loop bandwidth in an application where very low jitter and no modulation is desired. For example, the random or pseudo-random modulation and double calibration may be applied to the PLL device while it is "offline." The modulation and double calibration may be deactivated for runtime, and the unmodulated PLL device can have a more stable jitter performance due to the offline modulation and calibration.

This example may be particularly relevant for PLL devices 100 with undefined loop bandwidths, such as bang-bang PLL devices, for instance. For PLL devices 100 that are not needed to be online constantly, the offline tuning is not an issue. However, a modified low-level modulating signal and double calibration may be used while online with applications that cannot tolerate any offline PLL time.

In alternate implementations, other techniques may be included in the process 500 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:
1. An electrical circuit, comprising:
a first calibration loop for a phase-locked loop (PLL) device, including a cross correlator to correlate a sequence of random or pseudo-random signals injected into a signal path of the PLL device to a phase error signal of the PLL device, wherein the first calibration loop is arranged to multiply the random or pseudo-random signals of the sequence by the phase error signal and average results of the multiplying, and wherein the average is used to estimate a gain of a digitally controlled oscillator (DCO) of the PLL device; and a second calibration loop for the PLL device, comprising a bandwidth tuner to tune a bandwidth of the PLL device and to reduce a jitter of the PLL device.

2. The electrical circuit of claim 1, wherein the first calibration loop is arranged to adjust a gain of the DCO via a gain of an amplitude modulation signal based on the sequence of random or pseudo-random signals.

3. The electrical circuit of claim 1, wherein the second calibration loop is arranged to detect a deviation of a gain of one or more components of the PLL device and to apply a correction to the deviation.

4. The electrical circuit of claim 3, wherein the one or more components of the PLL device comprises at least one of the DCO and a modulation signal amplifier.

5. An apparatus, comprising:
a digitally controlled oscillator (DCO) to generate a clocking signal;
a value generator arranged to generate a sequence of random or pseudo-random values to modulate a frequency of the clocking signal to form a spread-spectrum clocking signal, wherein the value generator comprises a pseudo-random binary sequence (PRBS) generator;
a first calibration loop including a cross correlator to correlate the sequence of random or pseudo-random values to a phase error used to tune the DCO; and
a second calibration loop to detect and correct a deviation of a gain of the DCO.

6. The apparatus of claim 5, further comprising a digital loop filter, wherein digital loop filter comprises a portion of an input signal path to the DCO, and wherein the sequence of random or pseudo-random values is injected into a signal path comprising an output of the digital loop filter.

7. The apparatus of claim 6, wherein the second calibration loop is arranged to tune at least one of an integral parameter and a proportional parameter of the digital loop filter to maintain a constant ratio of the integral parameter to the proportional parameter.

8. The apparatus of claim 7, further comprising a look-up table having correction factors for tuning the integral parameter and the proportional parameter, the correction factors based on a deviation of an actual gain from an expected gain of an amplitude modulation signal.

9. The apparatus of claim 5, wherein the second calibration loop is arranged to detect and correct a deviation of an actual gain from an expected gain of an amplitude modulation signal.

10. The apparatus of claim 5, wherein the apparatus comprises of one of a digital, analog, or mixed signal phase-locked loop (PLL) device.

11. The apparatus of claim 10, wherein the second calibration loop is arranged to detect and correct a deviation of a bandwidth of the PLL device via detection and correction of the deviation of the gain of the DCO.

12. A method of calibrating a phase-locked loop (PLL) device, comprising:
cross correlating between a random or pseudo-random signal injected into a signal path of the PLL device and a phase error signal of the PLL device;
tuning a bandwidth of the PLL device based on a deviation of an actual gain to an expected gain of one or more components of the PLL device; and
modulating a frequency of a clocking signal of the PLL device with a random or pseudo-random signal to form a spread-spectrum clocking signal and calibrating the PLL device via the cross correlating and the tuning at one or more predefined intervals to reduce or eliminate jitter and to reduce electromagnetic interference of the PLL device.

13. The method of claim 12, further comprising tuning at least one of an integral parameter and a proportional parameter of a loop filter of the PLL device.

14. The method of claim 13, further comprising maintaining a constant ratio of the integral parameter to the proportional parameter during changes in process, voltage, or temperature of the PLL device.

15. The method of claim 13, further comprising maintaining a constant phase margin of the PLL device during changes in process, voltage, or temperature of the PLL device.

16. The method of claim 13, further comprising detecting the deviation of the actual gain to an expected gain of the one or more components of the PLL device, and applying a correction factor to the integral parameter and/or to the proportional parameter based on the detecting.

17. The method of claim 13, further comprising multiplying the integral parameter and the proportional parameter by a correction factor from a look-up table based on the deviation detected.

18. The method of claim 12, further comprising comparing an actual value of an amplitude modulation gain to an expected nominal value to detect a deviation of a gain of a digitally controlled oscillator (DCO) of the PLL device from nominal, and a deviation of the bandwidth of the PLL device.

19. The method of claim 12, further comprising maintaining a constant effective amplitude of a random or pseudo-random modulation signal of the PLL device during changes in process, voltage, or temperature of the PLL device via the cross correlating and the tuning.

20. The method of claim 12, further comprising maintaining a gain of a digitally controlled oscillator (DCO) of the PLL device during changes in process, voltage, or temperature of the PLL device via the cross correlating and the tuning.

21. The method of claim 12, further comprising reducing a jitter or a spread of the jitter of the PLL device based on the cross correlating and the tuning.

22. The method of claim 12, further comprising improving an electromagnetic compatibility of the PLL device during changes in process, voltage, or temperature of the PLL device via the cross correlating and the tuning.

23. The method of claim 12, wherein the one or more components of the PLL device comprise a digitally controlled oscillator (DCO) or a modulation signal amplifier.

24. An electrical circuit, comprising:
a first phase-locked loop (PLL) device including:
a first digitally controlled oscillator (DCO) to generate a first clocking signal;
a value generator arranged to generate a sequence of random or pseudo-random values to modulate a frequency of the first clocking signal to form a spread-spectrum clocking signal;
a first digital loop filter, arranged in an input signal path of the first DCO to control the first DCO; and
a calibration loop arranged to detect a deviation of an actual modulation gain to an expected modulation gain and to apply a first correction factor to a first integral parameter and/or a second correction factor to a first proportional parameter of the first digital loop filter based on the detecting; and
a second PLL device including:
a second DCO to generate a second clocking signal;

a second digital loop filter, arranged in an input signal path of the second DCO to control the second DCO, the second PLL device being calibrated by applying the first correction factor to a second integral parameter and/or the second correction factor to a second proportional parameter of the second digital loop filter.

* * * * *